United States Patent [19]
Spitzer et al.

[11] Patent Number: 5,666,175
[45] Date of Patent: Sep. 9, 1997

[54] OPTICAL SYSTEMS FOR DISPLAYS

[75] Inventors: Mark B. Spitzer, Sharon; Stephen Offsey, Brookline, both of Mass.; Jeffrey Jacobsen, Hollister, Calif.

[73] Assignee: Kopin Corporation, Taunton, Mass.

[21] Appl. No.: 298,355

[22] Filed: Aug. 29, 1994

Related U.S. Application Data

[63] Continuation of Ser. No. 971,403, Nov. 4, 1992, abandoned, which is a continuation-in-part of Ser. No. 944,207, Sep. 11, 1992, Pat. No. 5,444,557, Ser. No. 823,858, Jan. 22, 1992, abandoned, and Ser. No. 872,297, Apr. 22, 1992, Pat. No. 5,317,436, which is a continuation-in-part of Ser. No. 839,241, Feb. 20, 1992, abandoned, which is a continuation-in-part of Ser. No. 636,602, Dec. 31, 1990, Pat. No. 5,206,749.

[51] Int. Cl.$^6$ .................................................. G02F 1/1335
[52] U.S. Cl. ...................................... 349/95; 349/45
[58] Field of Search ............................... 359/40, 41, 42, 359/48, 49, 68, 63; 349/95, 45, 122, 57

[56] References Cited

U.S. PATENT DOCUMENTS

| | | | |
|---|---|---|---|
| 4,193,287 | 3/1980 | Pfeiffer | 359/63 |
| 4,292,370 | 9/1981 | Dekko | 359/63 |
| 4,580,876 | 4/1986 | Stolov et al. | 359/74 |
| 4,582,395 | 4/1986 | Morozumi | 350/334 |
| 4,610,509 | 9/1986 | Sorimachi et al. | 350/339 F |
| 4,644,338 | 2/1987 | Aoki et al. | 340/719 |
| 4,770,498 | 9/1988 | Aoki et al. | 350/334 |
| 4,776,675 | 10/1988 | Takaochi et al. | 359/68 |
| 4,786,966 | 11/1988 | Hanson et al. | 358/108 |
| 4,813,762 | 3/1989 | Leger et al. | 350/162.16 |

(List continued on next page.)

FOREIGN PATENT DOCUMENTS

| | | | |
|---|---|---|---|
| 0 352 636 A3 | 1/1990 | European Pat. Off. | |
| 0 362 776 A2 | 11/1990 | European Pat. Off. | |
| 3142664 A1 | 5/1983 | Germany | |
| 3723181 A1 | 1/1989 | Germany | |
| 3933862 A1 | 4/1991 | Germany | |
| 60-165624 | 8/1985 | Japan | |
| 60-165623 | 8/1985 | Japan | |
| 62-86328 | 4/1987 | Japan | 359/62 |
| 62-94826 | 5/1987 | Japan | |
| 62-293221 | 12/1987 | Japan | |
| 63-118125 | 5/1988 | Japan | |
| 63-147151 | 6/1988 | Japan | |
| 63-55529 | 10/1988 | Japan | G02F 1/133 |
| 1237592 | 9/1989 | Japan | |
| 64-48727 | 9/1989 | Japan | G02F 1/133 |
| 1-281426 | 11/1989 | Japan | |
| 4-9922 | 1/1992 | Japan | |
| 4009922 | 1/1992 | Japan | |

OTHER PUBLICATIONS

A.D. Kathman et al. "Microlens array for modification of SLM devices" Teledyne Brown Engineering, Optics Dept, Huntsville, AL.

James R. Leger, et al. "Astigmatic wavefront correction of a gain-guided laser diode array using anamorphic diffractive microlenses" *SPIE* 884:82–89 Computer–Generated Holography II (1988).

*Primary Examiner*—William L. Sikes
*Assistant Examiner*—James A. Dudek
*Attorney, Agent, or Firm*—Hamilton, Brook, Smith & Reynolds, P.C.

[57] ABSTRACT

An optical and projection system for viewing images produced on an active matrix slide is disclosed. An embodiment of the viewing system includes a graphic user interactive system in which images generated by a computer are controlled by a remote and are viewed on a viewing surface. The remote can be incorporated into the protective endcap of the active matrix slide. The light absorbed by the thin-film transistors of the active matrix can be reduced by tilting the more heavily shielded side of the thin-film transistors towards the light source. The invention further comprises an active matrix having an array of microlenses positioned to receive light from a light source. Each microlens converges and delivers light in a uniform or desired distribution to a corresponding pixel.

24 Claims, 10 Drawing Sheets

U.S. PATENT DOCUMENTS

| | | | |
|---|---|---|---|
| 4,813,770 | 3/1989 | Clerc et al. | 359/74 |
| 4,836,652 | 6/1989 | Oishi et al. | 359/40 |
| 4,904,061 | 2/1990 | Aruga | 350/339 F |
| 4,917,465 | 4/1990 | Conner et al. | 350/335 |
| 4,928,123 | 5/1990 | Takafuji | 353/20 |
| 4,948,231 | 8/1990 | Aoki et al. | 359/67 |
| 4,961,629 | 10/1990 | Kato | 350/332 |
| 4,995,702 | 2/1991 | Aruga | 350/331 R |
| 5,052,783 | 10/1991 | Hamada | 359/40 |
| 5,054,887 | 10/1991 | Kato et al. | 359/59 |
| 5,054,910 | 10/1991 | Kozaki et al. | 353/31 |
| 5,056,912 | 10/1991 | Hamada et al. | 353/38 |
| 5,073,772 | 12/1991 | Takafuji et al. | 340/784 |
| 5,075,798 | 12/1991 | Sonehara et al. | 359/490 |
| 5,087,113 | 2/1992 | Sakono et al. | 359/59 |
| 5,090,800 | 2/1992 | Ushiro | 353/71 |
| 5,091,792 | 2/1992 | Kaida | 359/67 |
| 5,092,664 | 3/1992 | Miyatake et al. | 359/41 |
| 5,126,863 | 6/1992 | Otsuka et al. | 359/41 |
| 5,151,801 | 9/1992 | Hiroshima | 359/41 |
| 5,161,042 | 11/1992 | Hamada | 359/41 |
| 5,187,599 | 2/1993 | Nakanishi et al. | 359/41 |
| 5,267,062 | 11/1993 | Bottorf | 359/49 |

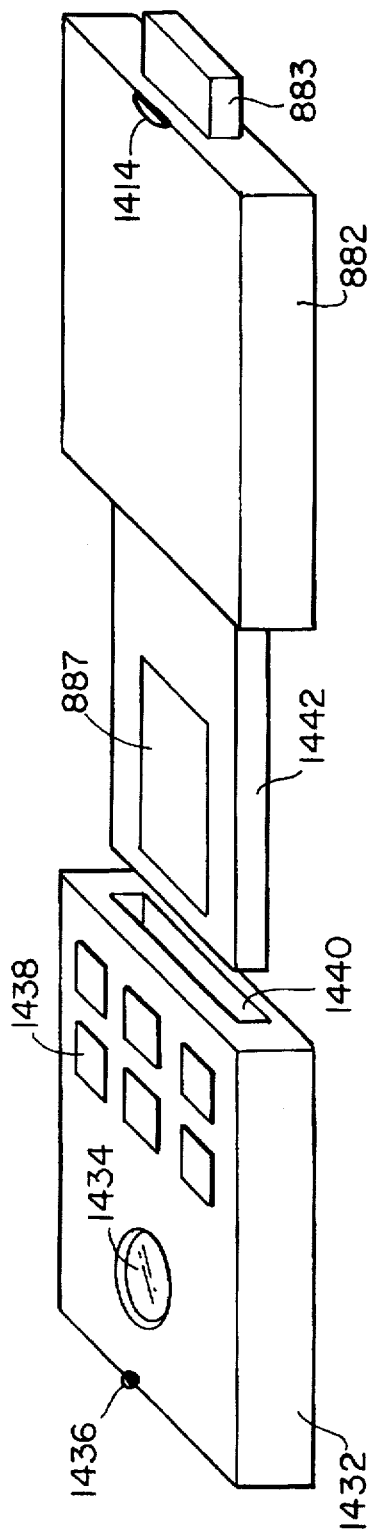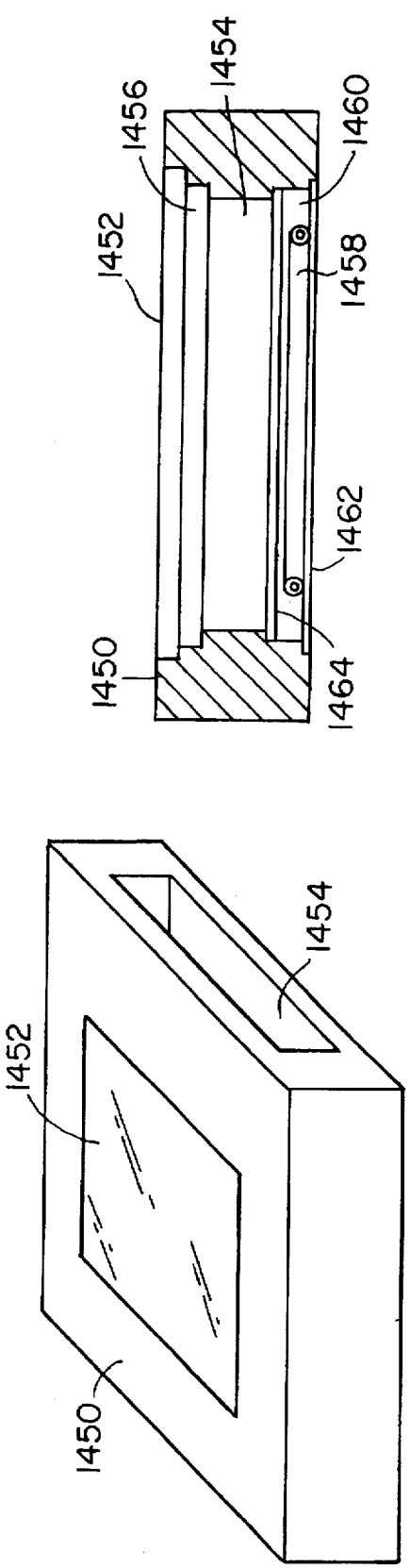

OPTICAL SYSTEMS FOR DISPLAYS

RELATED APPLICATION

This application is a continuation of application Ser. No. 07/971,403 filed Nov. 4, 1992, which is now abandoned which is a continuation-in-part of Ser. No. 07/944,207 filed Sep. 11, 1992 now U.S. Pat. No. 5,444,557 and of Ser. No. 07/823,858 filed Jan. 22, 1992 (Abandoned) and of Ser. No. 07/872,297 filed Apr. 22, 1992 (U.S. Pat. No. 5,317,436) which is a continuation-in-part of Ser. No. 07/839,241 filed Feb. 20, 1992 (Abandoned) which is a continuation-in-part of Ser. No. 07/636,602 filed Dec. 31, 1990 (U.S. Pat. No. 5,206,749).

BACKGROUND OF THE INVENTION

Flat-panel displays are being developed which utilize liquid crystals or electroluminescent materials to produce high quality images. These displays are expected to supplant cathode ray tube (CRT) technology and provide a more highly defined television picture. The most promising route to large scale high quality liquid crystal displays (LCDs), for example, is the active-matrix approach in which thin-film transistors (TFTs) are co-located with LCD pixels. The primary advantage of the active matrix approach using TFTs is the elimination of cross-talk between pixels, and the excellent grey scale that can be attained with TFT-compatible LCDs.

Flat panel displays employing LCDs generally include five different layers: a white light source, a first polarizing filter that is mounted on one side of a circuit panel on which the TFTs are arrayed to form pixels, a filter plate containing at least three primary colors arranged into pixels, and finally a second polarizing filter. A volume between the circuit panel and the filter plate is filled with a liquid crystal material. This material will rotate the polarization of light when an electric field is applied across it between the circuit panel and a ground affixed to the filter plate. Thus, when a particular pixel of the display is turned on, the liquid crystal material rotates polarized light being transmitted through the material so that it will pass through the second polarizing filter.

The primary approach to TFT formation over the large areas required for flat panel displays has involved the use of amorphous silicon which has previously been developed for large-area photovoltaic devices. Although the TFT approach has proven to be feasible, the use of amorphous silicon compromises certain aspects of the panel performance. For example, amorphous silicon TFTs lack the frequency response needed for large area displays due to the low electron mobility inherent in amorphous material. Thus the use of amorphous silicon limits display speed, and is also unsuitable for the fast logic needed to drive the display.

Owing to the limitations of amorphous silicon, other alternative materials include polycrystalline silicon, or laser recrystallized silicon. These materials are limited as they use silicon that is already on glass which generally restricts further circuit processing to low temperatures.

A continuing need exists for improvements in active matrix display systems having the desired performance and resolution, and providing for ease and reduced cost of fabrication.

SUMMARY OF THE INVENTION

The present invention includes an optical configuration for increasing the brightness of an active matrix display system employing three light valves. Light from first and second light sources are split into four components by polarizing beam splitters. Two first polarized light beams of the same orientation pass through first and second light valve active matrices. The remaining two polarized light beams are rotated to be in the same orientation as the first light beams, are combined and directed through a third light valve active matrix. This substantially increases the intensity of light passing through the third light valve matrix from light sources that emit two polarized components of light. Alternatively, one light source can be used with the light beam being split two times.

Another preferred embodiment of the present invention includes a compact active matrix projection display system. Light from a lamp is directed through an infrared filter and condenser lens before passing through a slide chamber housing an active matrix slide that is described in greater detail in the above referenced parent application. The illuminating light is valved as it passes through the active matrix, producing an image which is directed to an optical system. The optical system projects the image to a display surface.

A further preferred embodiment of the present invention is a graphic user interactive system. The user interactive system includes a projection device housing an active matrix slide. The active matrix slide is in communication with a computer and images generated by the computer are produced on the active matrix. The images are then projected onto a viewing surface. A remote control having a series of buttons and a trackball or other cursor control device allows graphic user interface with images projected on the viewing surface.

A preferred embodiment of the active matrix slide system includes a protective end cap which also contains a remote control circuit and acts as a remote control. Command signals from the remote end cap are emitted by an infrared LED and are received by an infrared sensor located on the active matrix slide or on the housing containing the slide.

Yet another embodiment of the present invention includes an active matrix slide end cap having a screen for direct viewing of images produced by the active matrix slide. Light from a light source within the end cap passes through a diffuser and the active matrix slide. The image produced can also be focused by a lens onto the viewing screen. Light could also be provided by an external source.

Another embodiment of the present invention is a compact unit for projecting and viewing images. Light from a lamp is directed by a mirror through an infrared filter and through an active matrix slide. The image produced by light passing through the active matrix slide is directed by a projection lens onto a viewing surface. The image can also be viewed simultaneously on a viewing screen located on the unit.

In a preferred embodiment of the present invention, an active matrix transmission display having shielded thin-film transistors is mounted relative to the light source such that light falls on the active matrix at an acute angle to optimize shielding. As the shielding over each transistor is not centered over the transistor in this embodiment, the effectiveness of the shielding is dependent upon the direction of light incident upon the active matrix. If the active matrix is tilted so that the part of the shielding which is more extensive is tilted towards the light source, then light leakage will is reduced. The tilted active matrix reduces the amount of light that reaches and is absorbed by the thin-film transistors.

In a further preferred embodiment of the present invention, a liquid crystal transmission display includes an optically transmissive substrate positioned to receive light incident from a light source. An array of pixel elements are bonded to the optically transmissive substrate. A light transmitting liquid crystal is positioned in close proximity to the pixel elements so that an electric field generated by each pixel element alters a light transmitting property of the liquid crystal. An array of microlenses are positioned to receive light incident from the light source. Each microlens converges light in a uniform distribution onto a corresponding pixel.

BRIEF DESCRIPTION OF THE DRAWINGS

The above, and other features of the invention including various novel details of construction and combination of parts, will now be more particularly described with reference to the accompanying drawings and that pointed out in the claims. The principle features of this invention can be employed in various embodiments without departing from the scope of the invention.

FIG. 3C is a perspective view of an embodiment of the active matrix slide assembly.

FIG. 3D is a perspective view of an embodiment of the endcap.

FIG. 3E is a sectional view of the endcap of FIG. 3D.

DETAILED DESCRIPTION OF PREFERRED EMBODIMENTS

Figure 1A:
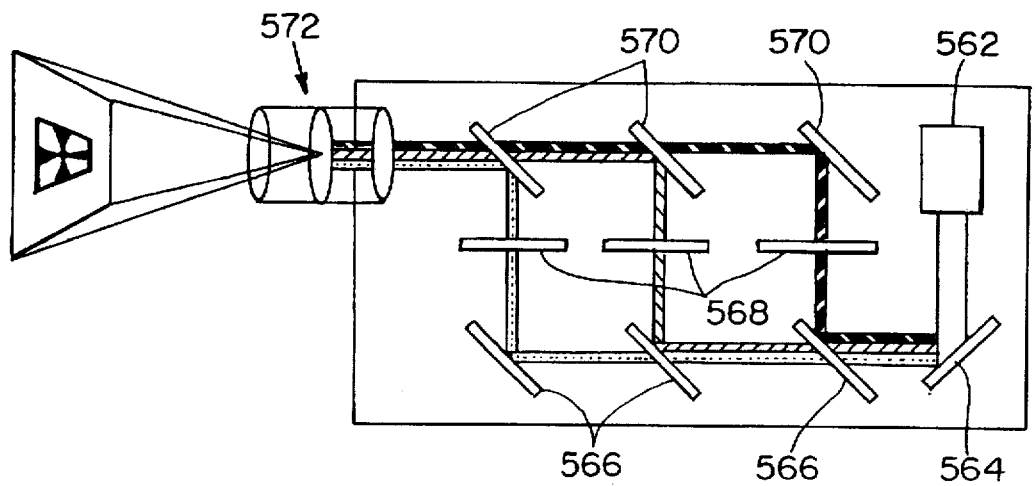
FIG. 1A is cross-sectional schematic illustration of an image projector of the present invention.

An image projector 560 employing the principles of the present invention is shown in FIG. 1A. The projector employs a zoom or variable focus lens 572 for projecting images to a viewing surface. The projection system of FIG. 1A employs an optical configuration for directing light. White light from a lamp 562 is reflected off a mirror 564 and directed to a mirror or mirrors 566 which can be dichroic. The separated colors of light are directed by the mirrors to illuminate the back side of three liquid crystal light valve matrices 568. Each matrix, controlled by a driver circuit (not shown), selectively transmits light to form an image in the respective primary color at the front side of the matrix. The three primary color images are directed via a mirror or mirrors 570 to lens 572. The mirrors 570 can be dichroic. The resulting images are directed through a zoom or variable focal length projection lens 572 to form an image beam capable of being front or back projected onto a viewing surface or screen. The lens combines the images into a single multi-color light beam. The projector provides high resolution images while being compatible with 35 mm optics.

Figure 1B:
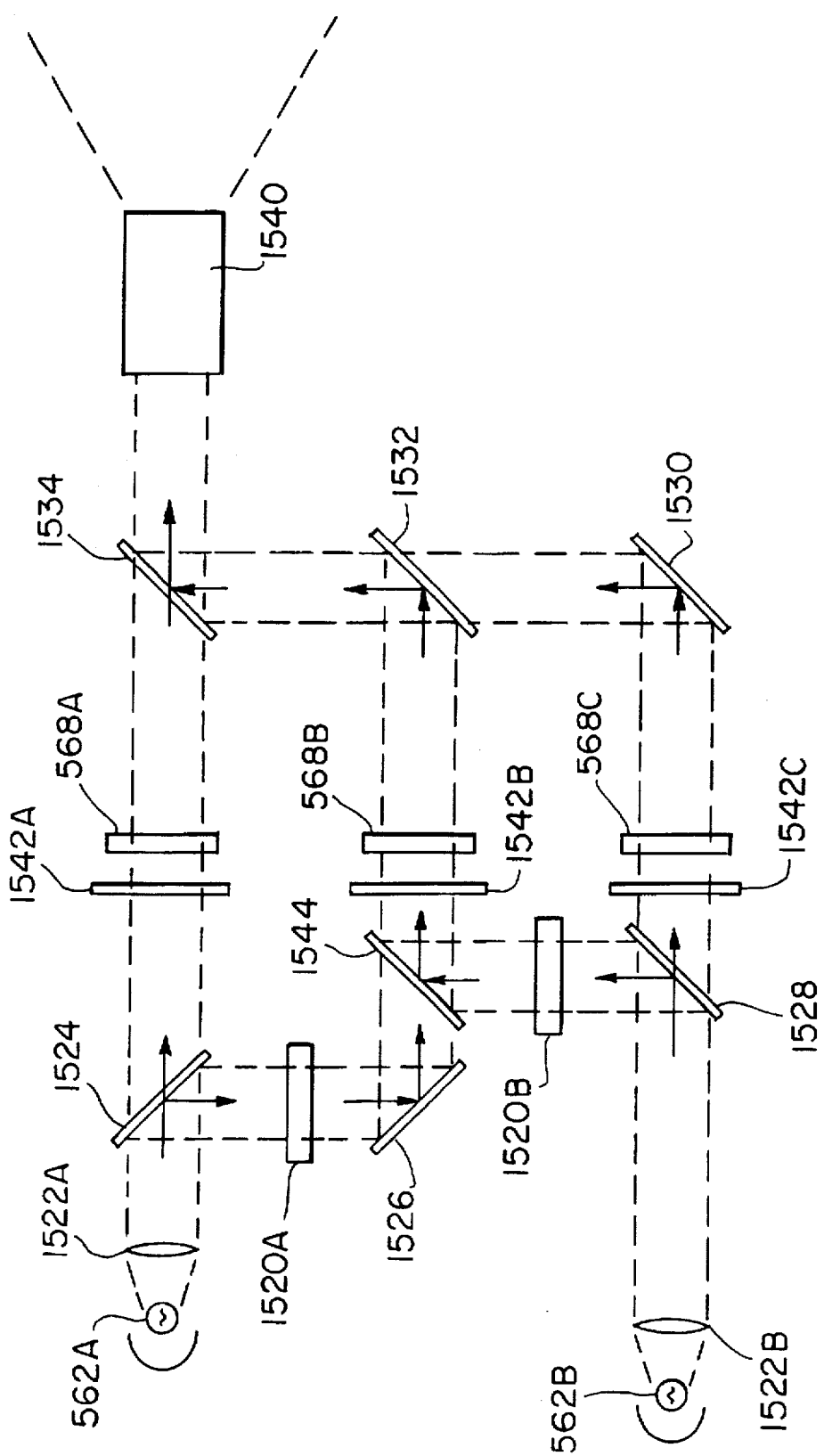
FIG. 1B is a schematic representation of an optical system employed to increase the optical efficienty of a transmission display.

Another preferred embodiment of the present invention is depicted in FIG. 1B. Light from lamp 562A passes through lens 1522A before reaching polarization beam splitter 1524. Element 1524 can be a Brewster polarizing window which passes light of one polarization only and reflects light of the other polarization. One half of the light continues through beam splitter 1524, passing through light valve active matrix 568A while the other half is reflected. The light passing through active matrix 568A produces an image of a first primary color and is directed to projection lens 1540.

The second half of the light is reflected by beam splitter 1524 and passes through polarization rotator 1520A. In the preferred embodiment, rotator 1520A is a liquid crystal device used to rotate the direction of polarization. However, alternatively, rotator 1520A can be a solid state crystal. Rotator 1520A rotates the light so that the second half of light is in the same orientation as the light passing through beam splitter 1524. The rotated light is reflected by mirror 1526 and is directed through active matrix 568B. The light passing through active matrix 568B produces an image of a second primary color. This image is directed to projection lens 1540 by mirrors 1532 and 1534 respectively.

Light from a second lamp 562B passes through lens 1522B and is split into two beams by polarizing beam splitter 1528. One half of this light is reflected by beam splitter 1528 and the other half passes through beam splitter 1528. The light that is reflected by beam splitter 1528 is rotated by polarization rotator 1520B so that the rotated light is in the same orientation as the light which passes through beam splitters 1524 and 1528. The rotated light is then directed by mirror 1544 through active matrix 568B. In this manner, light from both lamps 562A and 562B are directed to active matrix 568B which could actuate the blue component of a full color display, for example. The double intensity light passes through active matrix 568B and is directed to projection lens 1540 by mirrors 1532 and 1534, respectively.

The other half of light which passes through beam splitter 1528 passes through active matrix 568C. The light passing through active matrix 568B produces an image of a third primary color. This image is directed to projection lens 1540 by mirrors 1530 and 1534 respectively. The light from the three active matrices 568A, 568B and 568C are combined at projection lens 1540 and projected.

Alternatively, polarizers 1542A, 1542B and 1542C can be located in front of active matrices 568A, 568B and 568C, respectively. Polarizers 1542A, 1542B and 1542C keep the contrast ratio high and are described in greater detail in the above refferenced parent application.

The optical configuration of FIG. 1B substantially increases optical efficiency of the system. Additionally, color balancing can be performed by varying the relative output of lamps 562A and 562B.

Figure 1C:
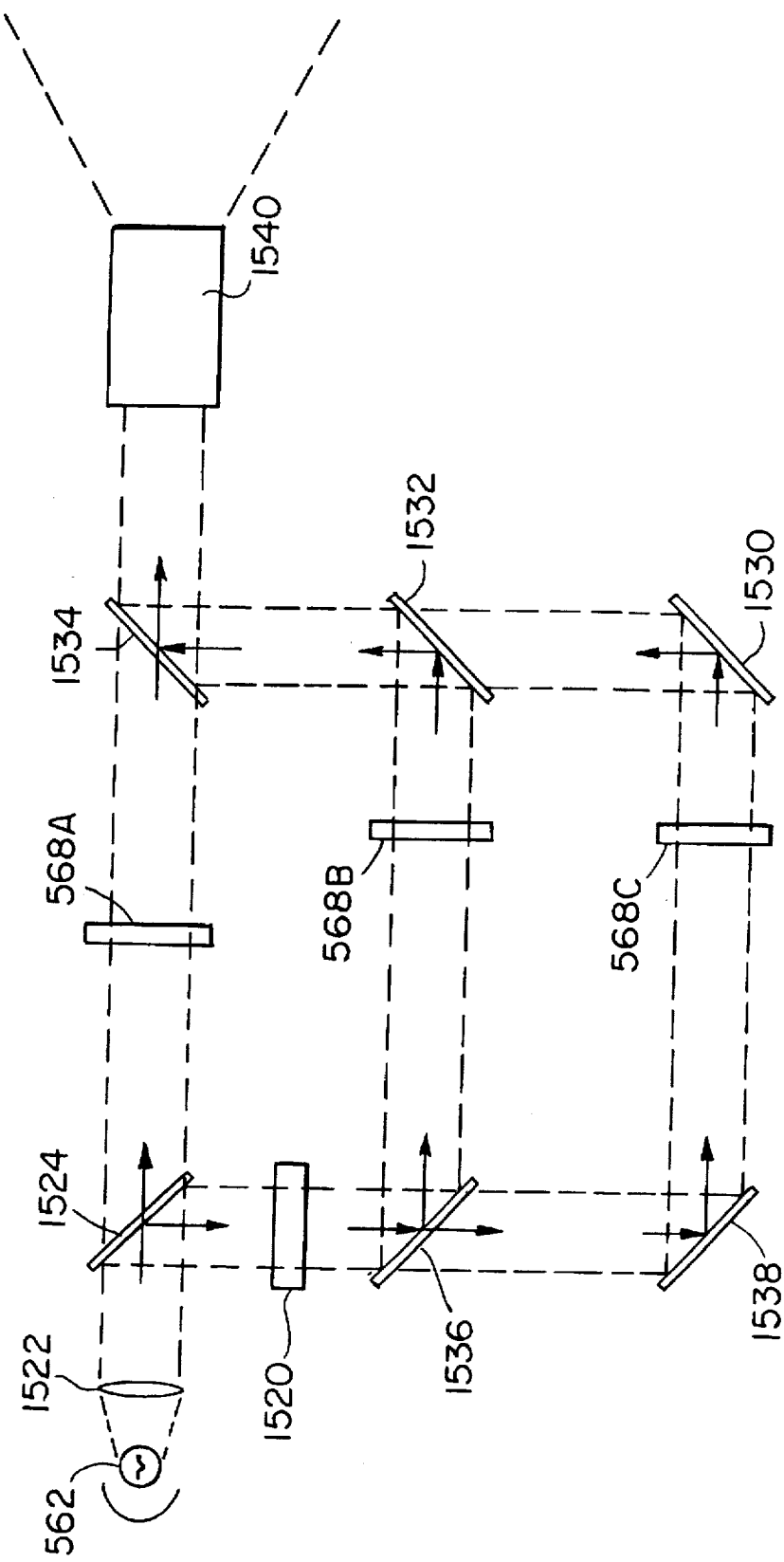
FIG. 1C is a schematic representation of an alternative optical system for improving optical efficiency.

Another preferred embodiment of the present invention is depicted in FIG. 1C. FIG. 1C depicts the optical configuration for a system employing either two or three active matrix elements. In a system using two active matrix elements, light from lamp 562 passes through lens 1522 before reaching polarizing beam splitter 1524. One half of the light is polarized and continues through beam splitter 1524 while the other half is reflected. The light which continues through beam splitter 1524 passes through active valve matrix 568A. The light passing through active matrix 568A produces an image of a first primary color and is directed to projection lens 1540.

The second half of the light reflected by beam splitter 1524 passes through polarization rotator 1520. Rotator 1520 rotates the light so that the second half of the light is in the same orientation as the light passing through beam splitter 1524. The rotated light is directed to light valve 568B mirror 1536. The light passing through matrix 568B produces an image of a second primary color which is directed to projection lens 1540 by mirrors 1532 and 1534 where the light is combined with light from matrix 568A. The combined images are then projected by projection lens 1540.

Alternatively, in a three matrix system, mirror 1536 is a beam splitter which further splits the rotated light in half. One half is directed to matrix 568B while the other half is directed to a third matrix 568C by mirror 1538. Light passing through matrix 568C produces an image of a third primary color which is directed to projection lens 1540 by mirrors 1530 and 1534 where the light is combined with light from matrices 568A and 568B. The combined images are then projected by projection lens 1540.

Figure 2A:
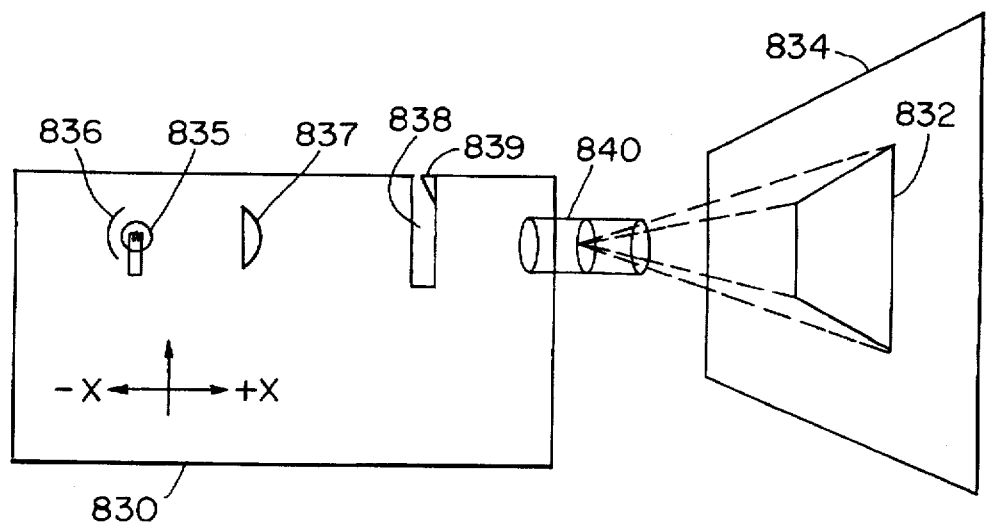
FIG. 2A is an illustration of a active matrix slide projector system in accordance with the present invention.

A active matrix system slide projector system is illustrated in FIG. 2A. The projector 830 produces images 832 that are projected to an enlarged surface 834 which may be a projection screen or any relatively flat surface.

Within the slide projector 830, light from a lamp 835 is directed by a reflector 836 and an optional condenser lens 837 to slide chamber 838. The spherical reflector 836 collects light emitted in the −X direction and directs it toward lens 837. The condenser lens 837 is preferably designed for maximum collection efficiency for collecting light emitted in the +X direction. The white light from the lamp 836 is directed to the active matrix positioned in the slide chamber 838. The illuminating light is manipulated as it passes through the slide, producing an image which is directed to an optical system 840. The image is projected by the optical system 840 to the surface 834.

In accordance with the present invention, the active matrix slide is adapted to be securely positioned in the slide chamber for selectively transmitting light from the lamp to provide monochrome or multi-color images to the optical system for projection onto a viewing surface.

An important feature of the active matrix slide of the present invention is that it is compatible with existing slide projectors. Referring to FIG. 2A, the slide chamber 838 of the projector 830 is dimensioned to accept a 2×2 inch slide having a thickness of up to ⅛ths of an inch. Since a standard 35 mm slide usually has a significantly smaller thickness, a spring-loaded slide holder 839 is provided to secure the slide in the chamber. In accordance with the present invention, an active matrix slide has a 2×2 inch face with a thickness of less than about ⅛ths of an inch such that it can be securely positioned in a slide chamber without modification thereto.

As explained previously with respect to other embodiments, the active matrix circuit panel has an array of pixels or light valves which are individually actuated by a drive circuit. The drive circuit includes first and second circuit components that are positioned adjacent to the array and electrically connected to the light valves for modulating the individual light valves so that the illuminating light may be selectively transmitted through the liquid crystal material to form a monochrome or multi-color image.

As noted above, the active matrix circuitry can be adapted to provide color images through the use of color filters. In one embodiment, while light from the projector light source can be passed through each of an arrangement of red, green and blue filters to the appropriate color assigned light value. Alternatively, a color filter can be fabricated directly onto each light valve and the light valves are arranged by filter color to provide uniform color images. For example, pixels can be arranged in a triad arrangement where three color filters are employed or the pixels can be arranged in a quad arrangement where four filters are employed.

In preferred embodiments, the active matrix circuit panel circuitry is formed in or on a layer of a semi-conductor material such as silicon. It is noted that any number of fabrication techniques can be employed to provide preferred thin-films of polysilicon or single crystal silicon. In embodiments in which the active matrix is formed in a thin-film of single crystal silicon, any of the previously mentioned pixel densities an be provided such that high resolution images are produced. Other preferred embodiments employ the use of a solid state material or any material whose optical transmission properties can be altered by the application of an electric field can be used to supply the light valves for the AM slide of the present invention.

Figure 2B:
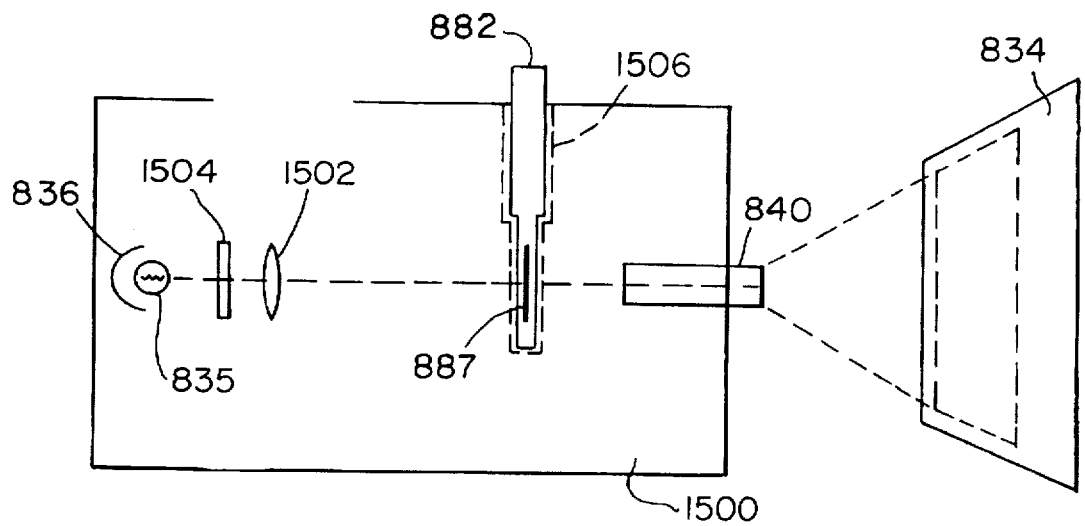
FIG. 2B is an illustration of an additional embodiment of the present invention.

FIG. 2B is a top view of another preferred embodiment of the present invention. In this embodiment, the capabilities of a conventional full size slide projector are accomplished by projector 1500. Projector 1500 does not have a carousel and is smaller and lighter than conventional slide projectors, the outer dimensions being around 6×8×3 inches.

Light from halogen lamp 835 is directed, with the aid of reflector 836, through infrared filter 1504 and condenser lens 1502 to slide chamber 1506. Slide chamber 1506 is dimensioned to accept active matrix slide 882. The illuminating light is valved as it passes though the active matrix 887, producing an image which is directed to optical system 840. The image is projected by the standard 35 mm projection lens system 840 to display surface 834.

Figure 2C:
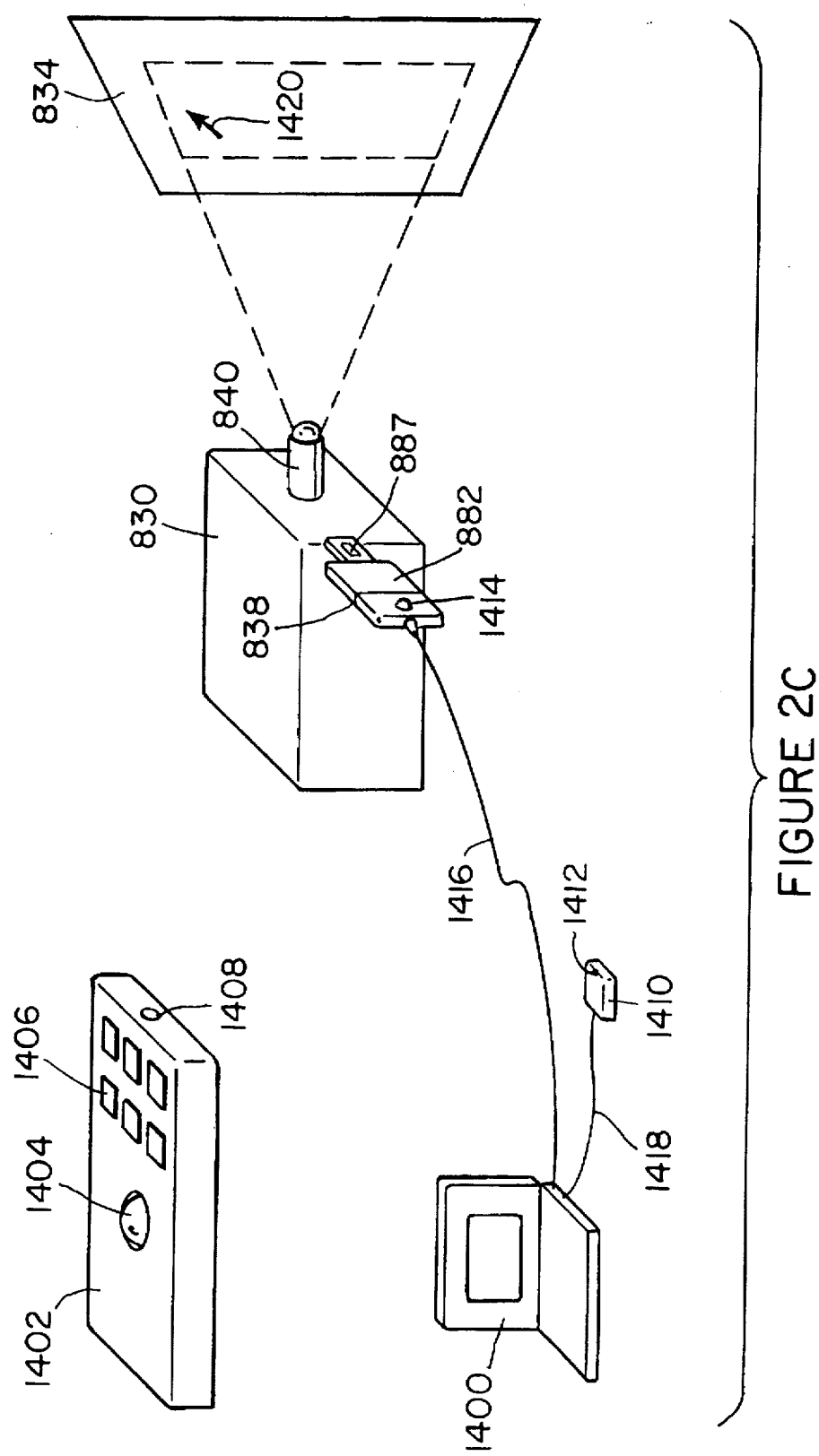
FIG. 2C is an illustration of the interactive system of the present invention.

Another preferred embodiment of the present invention is the user interactive system depicted in FIG. 2C. Active matrix slide assembly 882 is contained in slide chamber 838 of conventional slide projector 830. Cable 1416 connects the active matrix slide 882 to the video output port of computer 1400. Images from the computer 1400 are produced on active matrix 887. These images are projected by the optical system 840 of projector 830 to viewing surface 834.

Remote 1402 has a series of buttons 1406 and a track ball 1404. In the preferred embodiment, remote 1402 contains more than one button 1406 for performing various functions. Alternatively, remote 1402 can contain only one button 1406 functioning as an enter key. The track ball 1404 permits the user to move a pointer 1420 about the image projected on surface 834 and the buttons 1406 allow functions to be performed in conjunction with the image. Remote 1402 allows graphic user interface with images projected on the screen without entering commands on computer 1400. For example, remote 1402 allows "Windows" or computer aided design programs to be used interactively with the images projected upon surface 834. Command signals from remote 1402 are emitted by infrared LED 1408 and the signals are received by infrared sensor 1414, located on active matrix slide assembly 882. Circuitry for processing signals received by remote 1402 is formed within slide assembly 882 to generate interactive images on the active matrix. The signals can be relayed to computer 1400 through cable 1416.

Alternatively, sensor unit 1410 having infrared sensor 1412 can be used instead of infrared sensor 1414 on active matrix slide 882. Sensor unit 1410 is about 1×2×½ inches in size. When sensor unit 1410 is used, cable 1418 connects sensor unit to the serial port of computer 1400. Infrared sensor 1412 receives signals from infrared LED 1408 and can also relay the signals to computer 1400.

Figure 3G:
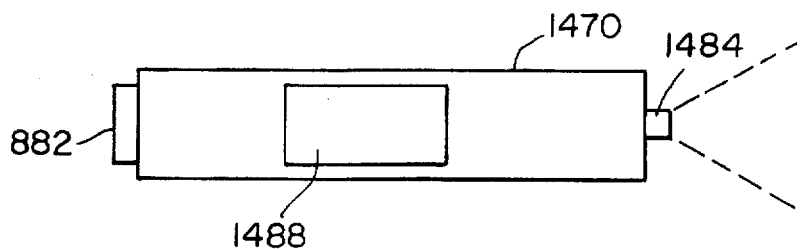
FIG. 3G is a top view of the compact unit of FIG. 3F.
Figure 3F:
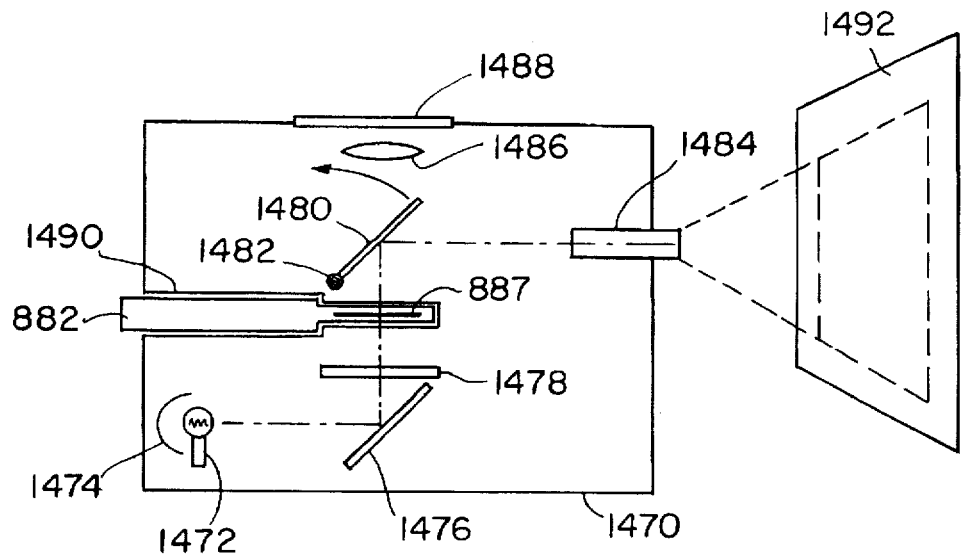
FIG. 3F is an illustration of a compact unit for projecting and viewing images.
Figure 3A:
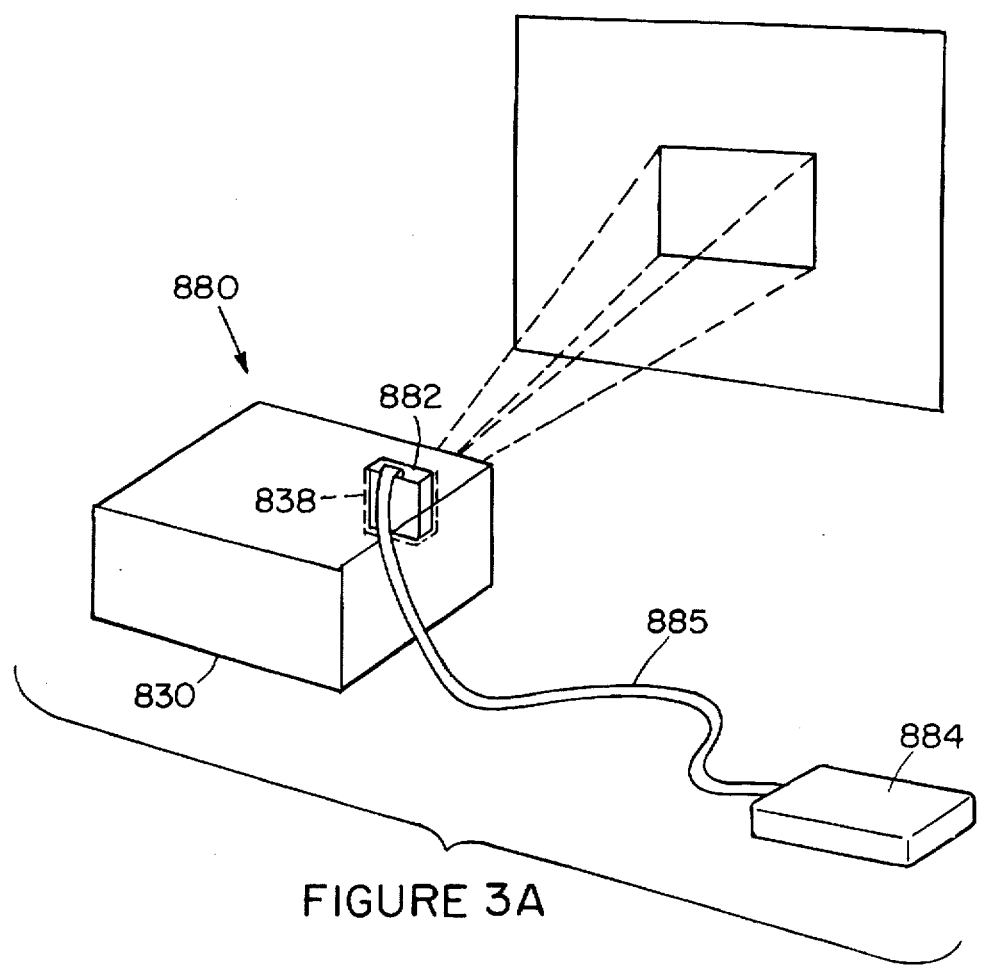
FIG. 3A is a perspective view of another embodiment of an active matrix slide assembly of the present invention.

In another preferred embodiment shown in FIG. 3A, an active matrix display 880 includes an active matrix slide 882 and a remote electronics housing 884. The slide 882 is dimensioned to be securely positioned in the chamber 838 of the slide projector 830. The slide 882 is electrically connected to electronics in the remote housing 884 by a cable 885.

Figure 3B:
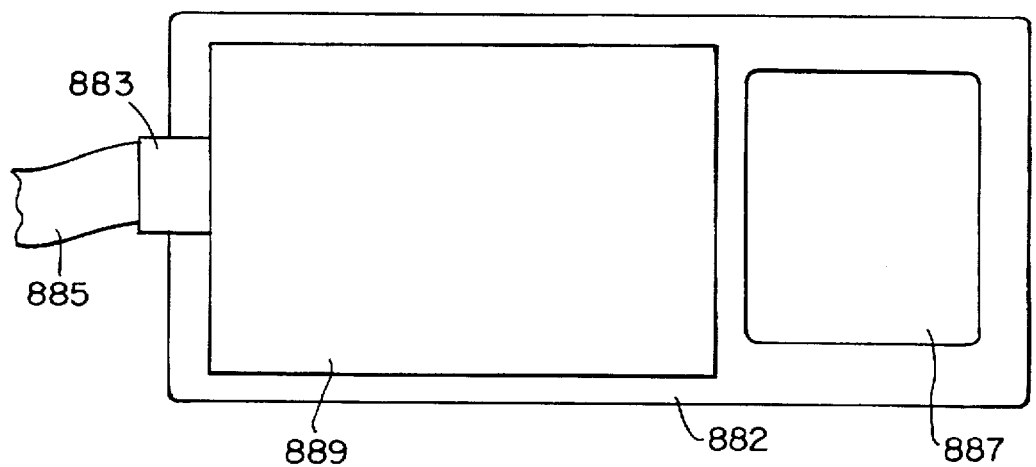
FIG. 3B is a plan view of an active matrix and collocated driver/signal processing circuitry for the active matrix slide of FIG. 3A.

Referring to FIG. 3B, the housing (not shown) is connected to an image generation device (not shown) which may be a computer or any video device. Image data provided by the device is received by the electronics in the housing at connector 883 and sent to the drive/signal processing circuitry 889 (described below) on the active matrix slide 882. Responsive to the received data, the circuitry 889 modulates the individual light valves of the active matrix 887 for providing monochrome or multi-colored images.

Another preferred embodiment of active matrix slide assembly 882 is depicted in FIG. 3C. Remote/endcap 1432 fits over and protects the active matrix 887 when the slide assembly 882 is not in use. The active matrix slide 882 and remote/endcap 1432 together is about 3×6×¾ inches in size or less. Cavity 1440 is dimensioned to allow active matrix 887 and active matrix holder 1442 to fit closely within cavity 1440. When active matrix slide 882 is in use, remote/endcap 1432 is separated from active matrix slide 882 and is used as a remote control. Located on remote/endcap 1432 are a series of buttons 1428 and trackball 1434. The trackball 1434 and buttons 1428 enables a graphics user to interactively interface with remote computer controlled images. Alternatively, remote/endcap 1432 can function without trackball 1434 and contain only the buttons 1428. Command signals from remote/endcap 1432 are emitted by infrared LED 1436 and are received by infrared sensor 1414 located on active matrix slide 882.

Another embodiment of the present invention is depicted in FIGS. 3D and 3E. Images produced on active matrix 887 (FIG. 3B) can be viewed on screen 1452 of endcap 1450. Active matrix 887 and active matrix holder 1442 of active matrix slide assembly 882 (FIG. 3C) fits closely within cavity 1454. Light emitted from light source 1458 passes through diffuser 1464 and active matrix 887. Light source 1458 is a flat tubular element which can be rectangular, bent into a circular configuration or any other suitable geometry. Cover 1462 retains light source 1458 within recess 1460 and has a reflective inner surface for reflecting light from light source 1452 towards active matrix 887. The image produced by the light passing through active matrix 887 passes through fresnel lens 1456 and is projected upon screen 1452.

A further preferred embodiment of the present invention is the projector 1470 depicted in FIGS. 3F and 3G. Projector 1470 is a compact unit for projecting and viewing images and is about 2×6×4 inches in size. Light from lamp 1472 is directed by reflector 1474 to cold mirror 1476. The light is redirected by cold mirror 1476 through infrared filter 1478 and active matrix 887. The majority of active matrix slide 882 fits into slide chamber 1490 and is protected. The image produced by the light passing through active matrix 887 is reflected by mirror 1480 and is projected by projection lens 1484 onto surface 1492. Alternatively, projector 1470 can be equipped with lens 1486 and frosted screen 1488 for viewing images on screen 1488 as well as on surface 1492. This alternative embodiment can take two forms. In the first alternative, knob 1482 is turned to swing mirror 1480 into an upright position, enabling images produced by light passing through active matrix 887 to pass through lens 1486 and be viewed upon screen 1488. In this manner, images can either be viewed on surface 1492 or screen 1488 depending upon the position of mirror 1480. In the second alternative, mirror 1480 is a beam splitter directing light to both screen 1488 and lens 1484. This second alternative allows images to be viewed on screen 1488 and surface 1492 simultaneously. In a further alternative, the length of projector 1470 may be reduced. In this case, a larger portion of active matrix slide assembly 882 protrudes from slide chamber 1490.

Figure 4:
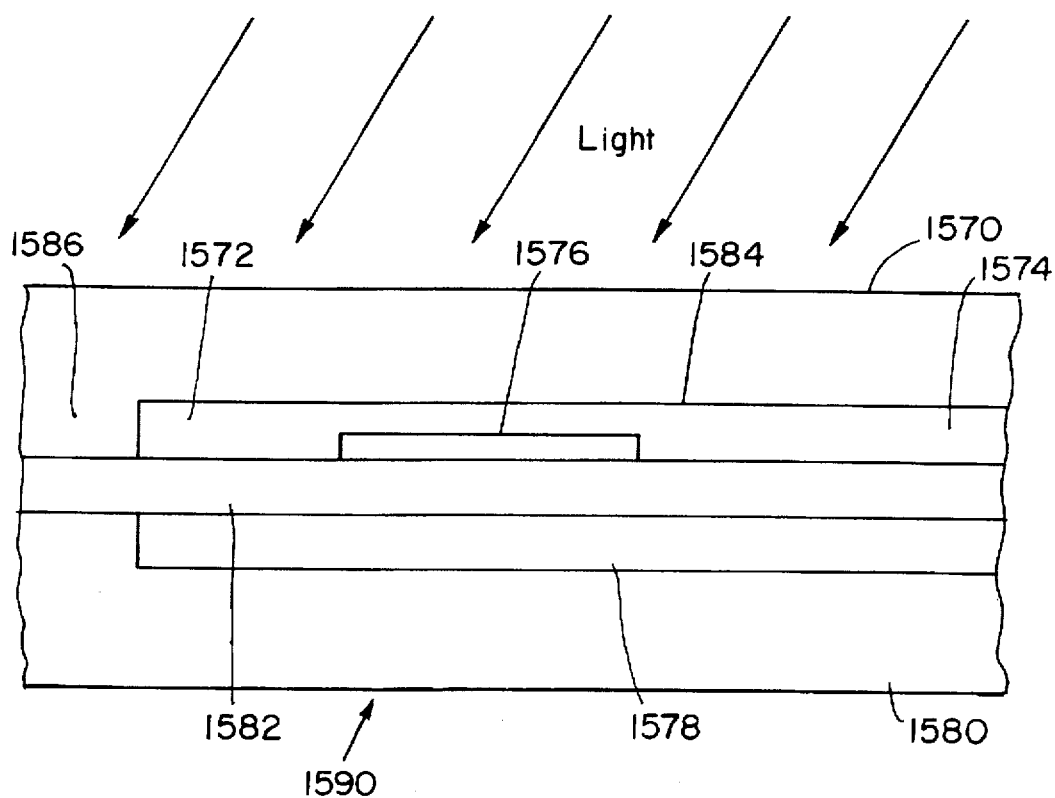
FIG. 4 is a practical sectional view of an active matrix showing the orientation of light to the matrix.

A further preferred embodiment of the present invention is depicted in FIG. 4. Active matrix liquid crystal display (AMLCD) 1590 has glass layers 1570 and 1580. Shields 1584 and 1578 shield thin-film transistor (TFT) 1576 from light projected through AMLCD 1590. Silicon dioxide layer 1582 separates shield 1584 from shield 1578. The silicon dioxide layer 1582 can be about 1 μm thick. Shield 1584 has two ends 1572 and 1574. End 1574 is longer and provides more shielding for TFT 1576 than end 1572. The ratio of the length of shield 1584 extending beyond TFT 1576 to the thickness of the opening is about 3 or greater to reduce scattering through the silicon dioxide layer. AMLCD 1590 is tilted so that end 1574 is tilted in the direction of the light source (not shown). Tilting the more extensively shielded end 1574 towards the light reduces the amount of light that can be scattered through layer 1582. Therefore, the amount of light able to reach and be absorbed by TFT 1576 is reduced, thereby preventing high leakage currents and loss of image quality or control.

Figure 5:
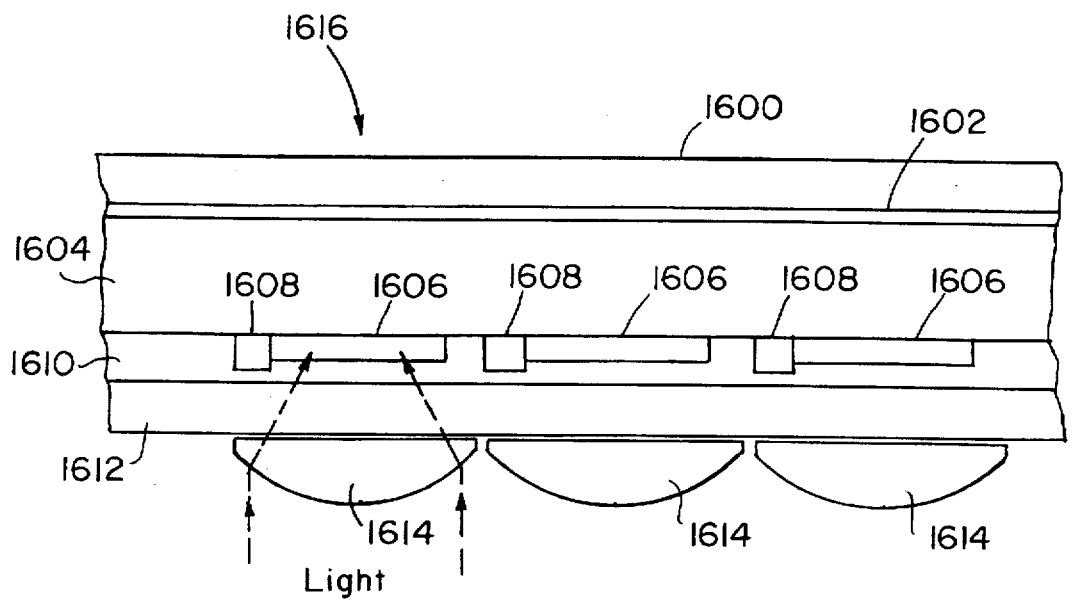
FIG. 5 is a practical sectional view of an active matrix having an array of microlenses.

Still another preferred embodiment of the present invention is depicted in FIG. 5. Display device 1618 has a liquid crystal 1604 covered with an electrode 1602 and a layer of glass 1600. Pixels 1606 and TFT's 1608 are sandwiched between liquid crystal 1604 and glass layer 1612. Pixels 1606 and TFT's 1608 are embedded in a layer of adhesive 1610. An array of individual microlenses 1614 are adhered to the surface of glass layer 1612. Each microlens 1614 is centered upon a corresponding pixel 1606. Microlenses 1614 are converging type lenses which are shaped and positioned so that pixels 1606 are in front of the focal point of microlenses 1614. As a result, light passing through microlenses 1614 are delivered to pixels 1606 in an uniform distribution over the surface of pixels 1606.

In a display device having 1000 lines per inch, the center of each microlens 1614 is spaced 0.001 inches apart. The edges of microlenses 1614 are positioned closely together in order to collect a maximum amount of light. This maximizes the delivery of incident light through pixels 1606. Light which would have fallen on regions surrounding pixels 1606 are focused through pixels 1606. The converging of light by microlenses 1614 also reduces the light absorbed by the TFT's 1606 because light is directed through pixels 1606 and not at TFT's 1606. This minimizes leakage currents as described previously. The use of microlenses in conjunction with light shielded TFT's in a single crystal thin film serves to substantially improve device performance.

Figure 6:
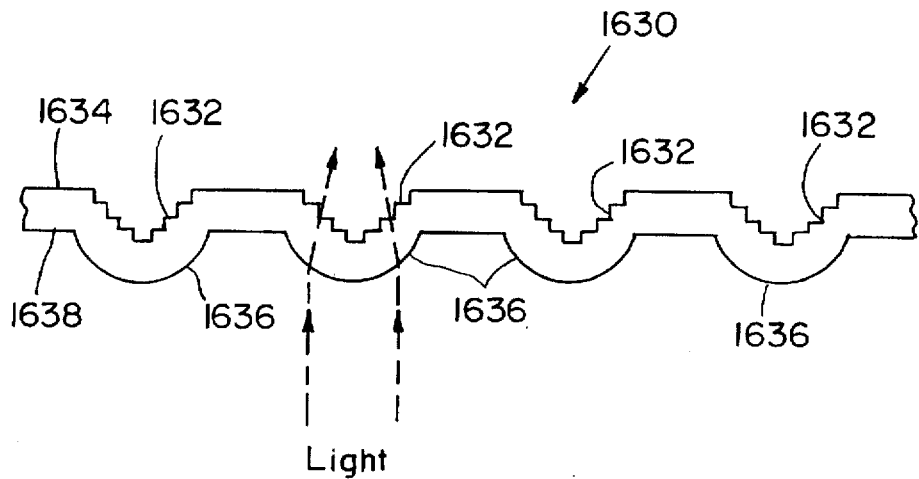
FIG. 6 is a practical sectional view of a one piece microlens array.

Alternatively, individual microlenses 1614 can be replaced by an array of microlenses formed from on single substrate. Such an array is depicted in FIG. 6 where microlens array 1630 is made from a single substrate of quartz. Alternatively, other substrates such as of glass or plastic can be used. The stepped faces 1632 act as a lens and converges light passing through microlens array 1630. Stepped faces 1632 are substantially similar to fresnel lenses, the design of which is well known. Stepped faces 1632 are etched into surface 1634 using known etching and masking techniques similar to that used in producing integrated electronic circuits. In fabricating microlens array 1630, a master mask is designed and generated using a computer aided design system. The mask pattern is then transferred onto the lens substrate using photolithography. The lens pattern is then reactive ion etched into the substrate.

In an alternative embodiment, convex faces 1636 can also be incorporated into microlens array 1630. The center of convex faces 1636 correspond with the center of stepped faces 1632. The addition of convex faces 1636 to microlens array 1630 shortens the focal length of microlens array 1630. Convex faces 1636 are formed on surface 1638 by grinding. Alternatively, convex faces 1636 can be molded. Microlens array 1630 is adhered to glass layer 1612 (FIG. 5). Light passing through convex face 1636 and stepped face 1632 is converged onto pixels 1606 (FIG. 5).

Figure 7:
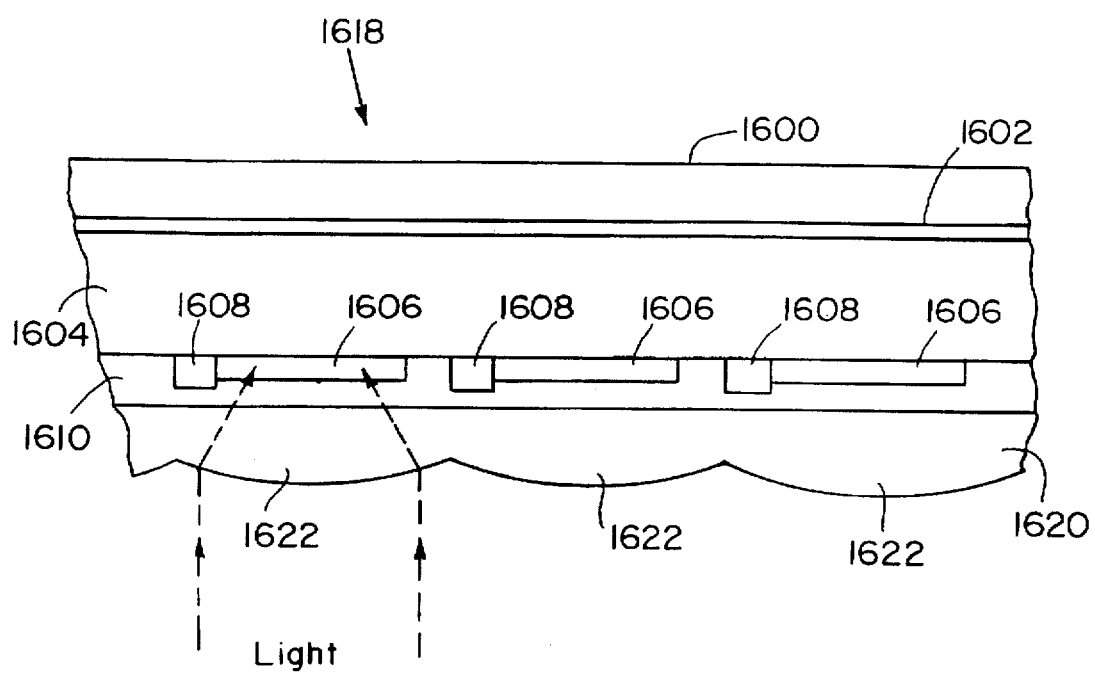
FIG. 7 is a practical sectional view of an active matrix having a one piece microlens array.

FIG. 7 depicts an alternative embodiment to that shown in FIG. 5. Display device 1618 is substantially the same as display device 1616 (FIG. 5) except that an array of converging lenses 1622 is part of the substrate 1620 of display device 1618. Converging lenses 1622 are ground into the surface of substrate 1620. Alternatively, coverging lenses can be molded. an adhesive is used to secure the lens array directly to the thin film active matrix as described in the parent applications. The thickness of the adhesive and the surface area of each pixel area define the dimensions of the microlens array and the specific geometry of each micro lens. In this embodiment the microlens array acts as a transfer substrate which receives and support the active matrix array during fabrication.

Figure 8:
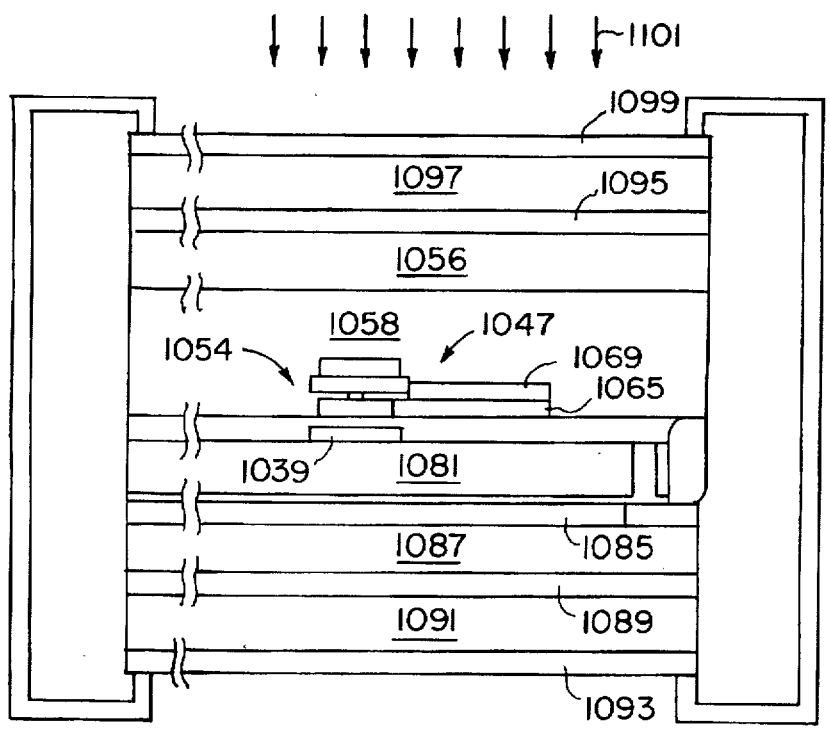
FIG. 8 is a partial cross-sectional view of an active matrix color display structure.

A partial cross-sectional view of an active matrix color display device is shown in FIG. 8. Each pixel electrode 1065 is laterally spaced from the counterelectrode 1085. Each pixel element 1047 will have a transistor 1054, a pixel electrode 1065 and an adjacent color filter element 1069 associated therewith. Polarizing elements 1089, 1095 are positioned on opposite sides of the structure. The display also includes the bonding element or adhesive 1058, the optically transmissive substrate 1056 which can include a microlens array as shown in FIG. 7, optically transmissive layers (1087, 1091, 1097), liquid crystal 1081, and ITO layers (1093, 1099). The structure is completed by positioning a light source for providing light 1101 adjacent to the ITO layer 1099.

In accordance with the present invention, an array of the color filter elements is formed adjacent to the array of pixel elements prior to transfer and subsequently transferred with the thin film and further processed to form an active matrix transmission display.

Figure 9:
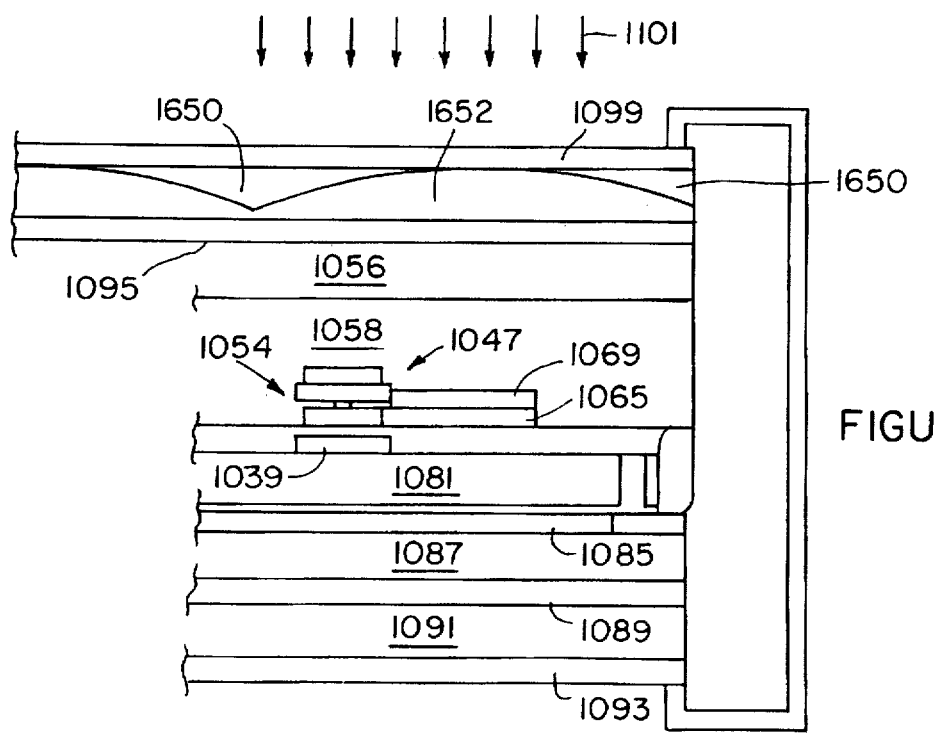
FIG. 9 is a partial cross-sectional view of an active matrix color display structure having a one piece microlens array.

FIG. 9 depicts another preferred embodiment of the present invention. An array of microlenses 1652 is one of the sandwiched layers. An ITO layer 1099 is adhered to the array of microlenses with adhesive 1650.

The microlenses of FIGS. 5, 6, 7 and 9 can alternatively have a dye added to the lens material to incorporate a color filter into the microlenses. The dye can be a single color or a pattern of colors in the array. Additionally, a colored film can be deposited on the surface of the microlenses as an alternative to adding dye.

Equivalents

While this invention has been particularly shown and described with reference to preferred embodiments thereof, it will be understood by those skilled in the art that various changes in form and details may be made therein without departing from the spirit and scope of the invention as defined by the appended claims.

We claim:

1. A liquid crystal transmission display comprising:
   an optically transmissive substrate positioned to receive light incident from a light source;
   an array of pixel electrodes bonded to the optically transmissive substrate with an adhesive layer, each electrode being connected to a pixel circuit;
   a light transmitting liquid crystal material positioned in close proximity to the pixel electrodes such that an electric field generated by each pixel electrode alters a light transmitting property of the liquid crystal material;
   an array of microlenses positioned to receive light incident from the light source, each microlens converges and delivers light through the adhesive layer and a corresponding pixel electrode; and
   a light shield array positioned between the pixel circuits and the array of microlenses.

2. The liquid crystal transmission display of claim 1 in which the array of microlenses is made up of a plurality of individual lenses.

3. The liquid crystal transmission display of claim 1 in which the array of microlenses is formed onto a single substrate.

4. The liquid crystal transmission display of claim 3 in which the array of microlenses is bonded to the array of pixel electrodes with an adhesive layer.

5. The liquid crystal transmission display of claim 3 further comprising a polarizing element bonded to the optically transmissive substrate, the polarizing element being disposed between the optically transmissive substrate and the array of microlenses.

6. The liquid crystal transmission display of claim 1 in which a dye is added to the array of microlenses.

7. An active matrix display panel comprising:
   an active matrix array of pixel circuits and pixel electrodes bonded to an optically transmissive substrate with an adhesive layer;
   a light shield array extending over each pixel circuit and positioned between each respective circuit and the adhesive layer;
   a light transmitting liquid crystal material positioned in close proximity to the pixel electrodes such that an electric field generated by each pixel element alters a light transmitting property of the liquid crystal material; and
   an array of microlenses positioned to receive light incident from the light source, each microlens converges and delivers the light to a corresponding pixel electrode and through the adhesive layer.

8. The display of claim 7 in which the array of microlenses is made up of a plurality of individual lenses.

9. The display of claim 7 in which the array of microlenses are formed in a single substrate.

10. The display of claim 7 in which the array of microlenses is bonded to the array of pixel electrodes with the adhesive, the array of microlenses comprising a stepped frensel structure.

11. The display of claim 7 further comprising a polarizing element bonded to the optically transmissive substrate, the polarizing element being disposed between the optically transmissive substrate and the array of microlenses.

12. The display of claim 7 in which a dye is added to the array of microlenses to provide a color filter.

13. A liquid crystal projection display comprising:

an array of pixel electrodes bonded to the optically transmissive substrate with an adhesive layer;

an array of pixel circuits formed in a single crystal silicon material, each pixel circuit being connected to a pixel electrode;

a light source optically coupled to the array of pixel electrodes;

a light transmitting liquid crystal material positioned in close proximity to the pixel electrodes such that an electric field generated by each pixel electrode alters a light transmitting property of the liquid crystal material;

a projection optical system for projecting light transmitted through the liquid crystal material onto a viewing surface;

an array of microlenses in or adjacent to the optically transmissive substrate positioned to receive light incident from the light source, each microlens converges and delivers the incident light to a corresponding pixel electrode and through the adhesive layer; and a light shield positioned between the microlens array and the array of pixel circuits.

14. The liquid crystal transmission display of claim 13 in which the array of microlenses is made up of a plurality of individual lenses.

15. The liquid crystal transmission display of claim 13 in which the array of microlenses is formed onto a single substrate.

16. The liquid crystal transmission display of claim 13 in which the array of microlenses is bonded to the array of pixel electrodes with adhesive.

17. The liquid crystal transmission display of claim 13 further comprising a polarizing element bonded to the optically transmissive substrate, the polarizing element being disposed between the optically transmissive substrate and the array of microlenses.

18. The liquid crystal transmission display of claim 13 in which a dye is added to the array of microlenses to form a color filter.

19. The liquid crystal transmission display of claim 13 further comprising a color filter layer formed on a surface of each microlens.

20. The liquid crystal transmission display of claim 13 further comprising a plurality of color filters dyes, each microlens having one dye to form a color filter element.

21. A method of fabricating a microlens active matrix display comprising:

forming an array of pixel circuits in a layer of single crystal silicon;

forming an array of pixel electrodes that are each connected to one of the pixel circuits;

forming a light shield array over the array of pixel circuits;

providing a microlens array in an optically transmissive substrate;

bonding the microlens array to the array of pixel circuits and the array of pixel electrodes with an optically transmissive adhesive layer to provide a laminated structure such that light directed through the microlens array is directed through the adhesive layer onto either the light shield array or the array of pixel electrodes.

22. The method of claim 21 further comprising providing a polarizer positioned between the microlens array and the adhesive layer.

23. The method of claim 21 further comprising providing an second optically transmissive substrate positioned between the microlens array and the adhesive.

24. The method of claim 21 further comprising forming a cavity for a liquid crystal material adjacent to the array of pixel electrodes and inserting a liquid crystal material into the cavity.

* * * * *